United States Patent [19]

Hunt et al.

[11] Patent Number: 4,571,850
[45] Date of Patent: Feb. 25, 1986

[54] CENTRIFUGAL WAFER PROCESSOR

[75] Inventors: James R. Hunt, Westminster; Russell P. Balent, Fountain Valley, both of Calif.

[73] Assignee: The Fluorocarbon Company, Anaheim, Calif.

[21] Appl. No.: 611,522

[22] Filed: May 17, 1984

[51] Int. Cl.$^4$ .................. F26B 25/00; F26B 11/02; F27D 1/18

[52] U.S. Cl. ........................... 34/242; 34/133; 432/242

[58] Field of Search ............... 34/133, 242; 432/242

[56] References Cited

U.S. PATENT DOCUMENTS 2,975,528   3/1961  Shewmon ..................... 34/133
4,207,686   6/1980  Daily ............................ 34/242

Primary Examiner—John J. Camby
Attorney, Agent, or Firm—Knobbe, Martens, Olson & Bear

[57] ABSTRACT

In a rinser/dryer for carriers of semiconductor wafers, a rotatable frame containing the carrier is directly mounted to, and cantilevered from the drive motor. A container encloses the rotatable frame and carrier. A gas pressurized labyrinth seal separates the inside of the container from the drive motor to prevent contamination. A raised portion in the labyrinth seal, with gas inlets on each side of the raised portion, forms a pressure barrier inhibiting the passage of moisture and contaminates across the barrier.

20 Claims, 7 Drawing Figures

CENTRIFUGAL WAFER PROCESSOR

BACKGROUND OF THE INVENTION

This invention relates to a device for processing semiconductor wafers or glass photomask plates, and in particular, to an improved rinser/dryer which minimizes the vibration during rotation of the carrier containing the wafers or photomask plates, and which further minimizes particulate contamination level.

The production of integrated circuits requires the use of semiconductor wafers or substrates. The processing of the semiconductor wafers requires multiple steps through which various layers of material are deposited and processed on the wafer substrate. The substrates themselves are typically of circular shape, several inches in diameter, with many wafer disks now being 100-150 mm in diameter. The wafers are very fragile, typically being made of glass or ceramic and having a thickness in the neighborhood of 0.025 inches.

The processing of the materials deposited upon these fragile substrates requires that the wafers be rinsed or coated with numerous solutions at various stages of the processing. At some stage almost all wafers require a rinsing and drying. It is more efficient if the washing and drying can be completed by a single machine. A uniform rinsing of the wafers can best be achieved by rotating the wafers while spraying them from a stationary nozzle. Since a number of wafers are placed in a carrier for ease of handling, it is more efficient to handle all the wafers simultaneously, in the carrier, during the rinsing/drying stage.

Various processing devices have been developed to complete this rinse/dry cycle. One such device is described in U.S. Pat. No. 4,300,581, to Thompson, in which a wafer carrier is placed into a frame that is rotated while stationary nozzles inject a fluid to rinse the wafers, or alternately inject heated gas to dry the wafers.

The Thompson patent has the frame containing the carrier enclosed, and sealed from the inside of a tub in order to inhibit contamination of the wafers during processing. The drive which rotates the frame is also sealed from the inside of the tub, by a rotational seal. This seal is a load bearing seal, subject to wear and degradation which in turn generates particulate contaminants. Thus, there is a need for a seal between the drive and the rotated frame which does not generate contaminants. It is an object of this invention to provide such a seal.

Too minimize the particulate contaminants which enter the tub and contaminate the wafers, at least one device uses a magnetic fluid in the seal. The magnetic fluid seal is subject to evaporation of the carrier fluid which degrades the effectiveness of the seal. Additionally, the location of the seal inhibits checking the fluid level and replacing lost fluid. Thus, there is a need for a seal which requires little inspection and is easy to maintain. It is an object of this invention to provide such a seal.

The rotating frame in the Thompson device is driven by a motor through a belt and pulley arrangement. This belt and pulley arrangement not only consumes a large amount of space, but introduces flexibility between the motor and the rotating frame which can exacerbate the oscillations occurring in the cantilever, but rotating frame. Since vibration of the carrier and wafers can damage the fragile wafers, it is desirable to reduce or minimize the amount of vibration introduced into the wafer carrier. It is an object of this invention to reduce the vibrational force exerted on the wafers during rinsing/drying. It is also important that vibration of the tub and any enclosing structure be minimized. Thus, it is a further object of this invention to minimize the vibration transmitted to the enclosing structure and housing.

The Thompson device also contained a vent in the door through which the carrier and wafers were loaded into the apparatus. This vent allows ambient air to carry contaminants into the tub and contribute to the contamination of the wafers in the apparatus. This contamination was exacerbated during the rinsing cycles when air was sucked through the vents by vacuum created by the withdrawing of rinse water. This suction could entrain far heavier particles in the incoming air stream than might normally pass through the vent in the Thompson apparatus. Thus, a device is needed which eliminates the contamination by ambient air during the rinsing cycle. It is an object of this invention to provide this reduction in contamination.

SUMMARY OF THE INVENTION

The device of this invention is a washer/dryer for use with carriers of semiconductor wafers. The device provides a direct drive between the motor and a rotatable frame containing the wafer carrier, such that there is no bearing outside the motor that might generate contaminants. The direct drive also eliminates many of the vibrational problems introduced by the drive trains of the prior art. A non-load bearing, positive pressure, gas seal between the drive motor and a container enclosing the rotatable frame minimizes the generation and introduction of contaminates into the processing container. The seal also pressurizes the inside of the container enclosing the rotatable frame and wafer carrier so that contaminants in the surrounding environment cannot be introduced into the container and onto the wafers therein.

To this end, the device of this invention has an electric motor mounted to a support structure by vibration isolation mounts. The motor has a drive shaft which connects to an interfacing flange or hub mounted on the back of a rotatable frame in a direct drive arrangement. The frame is adapted to receive and hold a carrier full of semiconductor wafers in such a way that the carrier can be rotated with the frame, without damage to the wafers. This direct line advantageously provided a means of reducing the vibration introduced by the drive train. A retention bar helps to hold the wafers in the carrier at low rotational speeds. The center of the wafers are offset from the rotational axis such that at higher rotational speed, a centrifugal force is exerted which forces the wafers into the carrier in order to securely hold the wafers during rotation.

The rotatable frame is enclosed by a container which has a door through which the wafer carrier can be inserted into the rotatable frame. To facilitate loading of the wafer carrier, and to inhibit the wafers from rattling around in the carrier, the rotatable frame is inclined at an angle with respect to the horizontal surface so that the wafer carrier slideably drops into the rotatable frame. The inclined orientation causes the wafers to rest against one side of the individual wafer slots, or supports in the carrier.

A positive pressure gas seal is placed around the drive shaft at the back of the flange on the rotatable frame.

Since the frame is cantilevered directly off of the motor drive shaft, there is no need for this gas seal to be load supporting. Thus, the seal advantageously generates no contaminants. The positive gas pressure prevents airborne contaminants from entering the seal to contaminate the wafers.

The gas seal also communicates with the inside of the container in order to positively pressurize the container and prevent contaminants from entering the container. Vents allow the escape of the pressurized gas, but the positive pressure prevents airborne contaminants from entering the vents to contaminate the wafers.

A pressure barrier is placed in the gas seal to further inhibit moisture and contaminates from traversing the gas seal. A raised area or boss reduces the cross sectional area of the gas seal to form a pressure barrier. This restricted area inhibits the flow of gas and entrained contaminates across this pressure barrier. Gas inlets positively pressurizing the seal are placed on each side of this pressure barrier. These inlets, in combination with the pressure barrier, force gas away from the barrier to further prevent contaminates from crossing the barrier and entering the container. This pressure barrier further serves to prevent moisture from passing the barrier, so the moisture cannot escape the container.

DESCRIPTION OF THE DRAWINGS

These and still other features of the invention will now be described with reference to the drawings of the preferred embodiment which is intended to illustrate, but not to limit the invention, and in which.

DESCRIPTION OF THE PREFERRED EMBODIMENT

Figure 1:
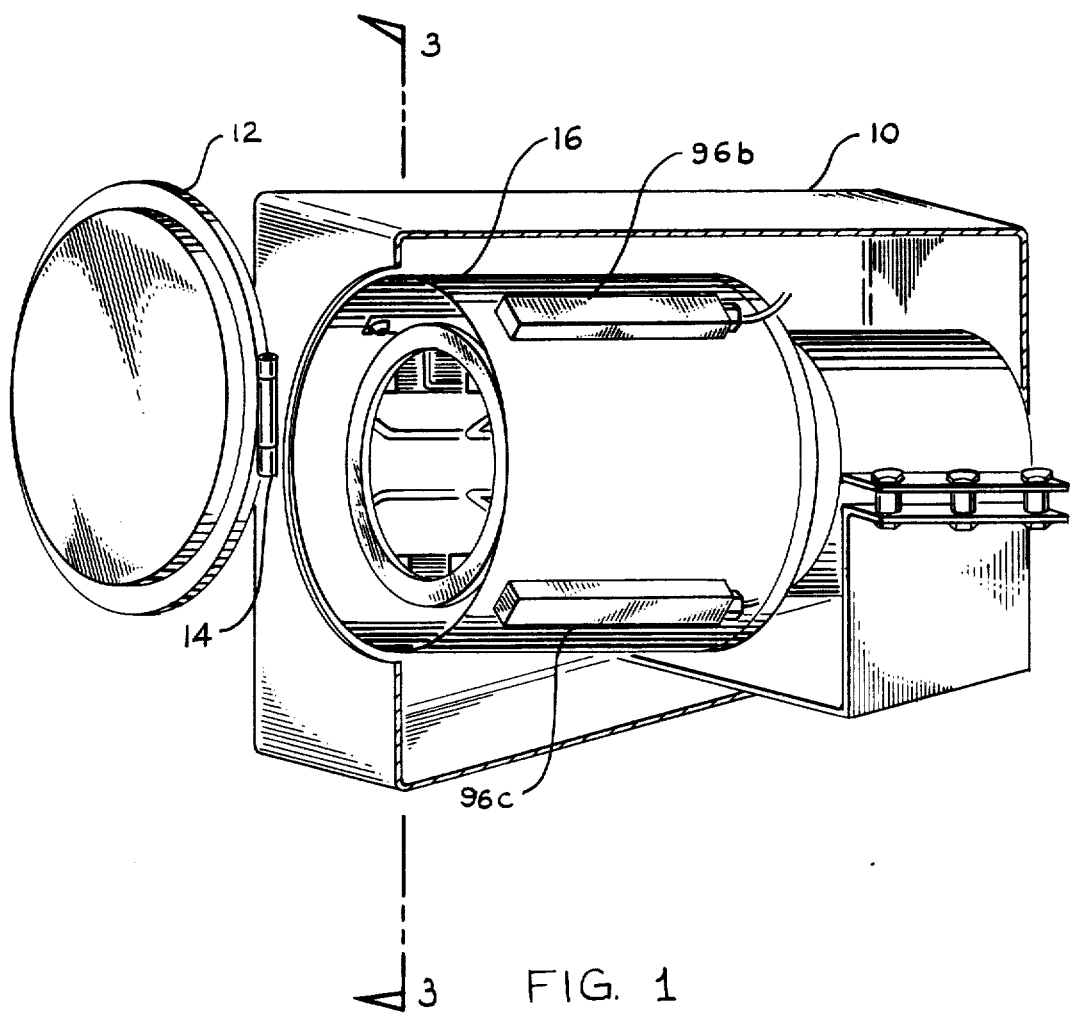
FIG. 1 is partially sectionalized perspective view of the rinser/dryer of this invention.

FIG. 1 shows the device of this invention in which a housing 10 has a door 12 on the side of the housing, which door rotates about axis 14 to open or close and provide access to a container or bin 16 enclosed in housing 10. The door 12 provides a gas-tight seal when it is closed. The container 16 has an aperture or opening 18 which coincides with the location of door 12 and provides access to the inside of the container 16.

Figure 2:
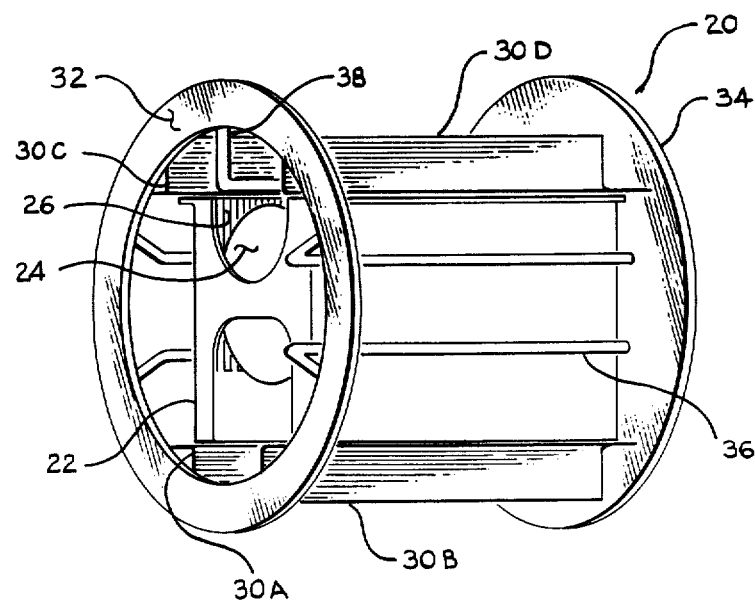
FIG. 2 is perspective view of a rotatable frame and wafer carrier used in the device of FIG. 1.
Figure 3:
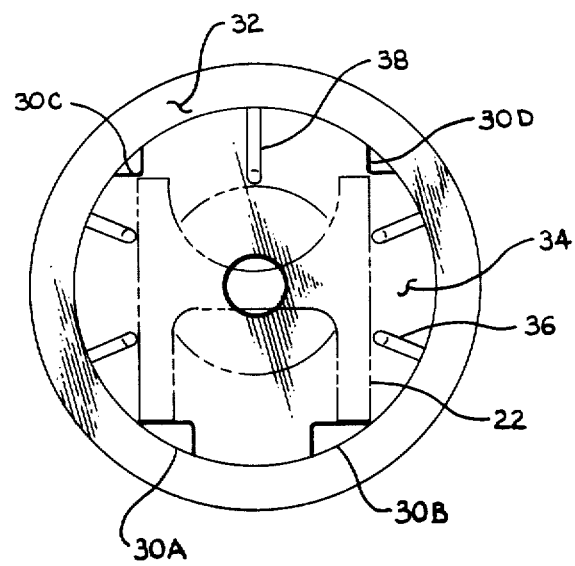
FIG. 3 is a front view of FIG. 2 showing the carrier in phantom.

FIG. 2 and 3 show a rotatable frame 20 in which is slideably mounted a wafer carrier 22 containing wafers 24. The wafers 24 are typically thin circular disks having diameters of three or four inches, and a thickness of approximately 0.030 inches. The wafers 24 commonly slide into slots 26 in the carrier 24 such that the edges of the wafers 24 are held by the slots 26.

The wafer carrier 22 can be of diverse shape and design, and is illustrated as having a support frame 28 of a generally rectangular construction, with the frame 28 being opened at the top so that wafers 24 can be inserted into the frame 28. The wafer carrier 22 is typically made of a polymer material such as polypropylene or of teflon such as FEP or TFE teflon. Slots 26 are located along two opposing, longitudinal sides of rectangular frame 28. The slots 26 are accessible from the open side of the frame 28.

Rotatable frame 20 is configures to removably and slideably receive the shape of wafer carrier 22. Accordingly, the shape of the rotatable frame 20 will vary depending on the shape of the carrier 22 being used. For the rectangular carrier 22 previously described, the rotatable frame 20 has a corresponding rectangularly shaped receptacle. Thus, the rotatable frame 20 is shown having four longitudinal support struts 30 which are located to correspond with the four longitudinal edges of the rectangular wafer carrier 22. An end plate 32 is connected to a first end of the support struts 30. The support struts 30 can take the form of angle irons oriented such that two lower struts 30A and B have a horizontal leg which supports the bottom of an inserted wafer carrier 22. The second leg of the struts of 30A and B extends downward. The upper support struts 30C and D each have one horizontal leg adjacent to the top corner of an inserted wafer carrier 22, with the second leg of the struts 30B and C extending upward.

End plate 32 can be of diverse shape but preferably takes the form of a symmetric or dynamically balanced structure such as a circular disk. End plate 32 has an opening 34 sufficiently large to accommodate the insertion of wafer carrier 22 into the rotatable frame 20. Thus, the shape of end plate 32 preferably takes the form of an annular ring having an inner and outer diameter and a relatively smaller thickness, with the first ends of support struts 30 being connected to one surface of the end plate 32.

A second end plate or rotor 34 is located at the end of rotatable frame 20 opposite end plate 32. Rotor 34 can be of diverse shape but is preferably symmetrical or dynamically balanced for rotation about a predefined axis. Thus, rotor 34 preferably takes the shape of a circular disk. Rotor 34 is connected to the second end of struts 30.

Rotor 34 and end plate 32 thus connect to opposite ends of support struts 30. The support struts 30 are arranged in a generally rectangular shape which corresponds to the shape of wafer carrier 22 so that the carrier 22 can be removably and slideably inserted into and supported by the rotatable frame 20.

A plurality of stabilizing bars 36 are also fastened to end plate 32 and rotor 34. In the illustrated embodiment there are four stabilizing bars 36 shaped and oriented so that they support the sides of wafer carrier 22 when the carrier 22 is inserted into the rotatable frame 20 and rotated. The stabilizing bars 36 help react the centrifugal forces exerted on carrier 22. The size, shape, and location of the bars 36 will vary according to the construction of the carrier 32 and according to the rotational velocity of the frame 20 and carrier 22.

There is also a wafer retainer bar 38 connected to rotor 34 and end plate 32. This retainer bar 38 is mounted between the end plate 32 and rotor 34 such that the bar 38 is touching or in close proximity with the edge of wafers 24 in carrier 22, when that carrier is inserted into the rotatable frame 20. The retainer bar 38 keeps the wafers 24 from falling out of the carrier 22 during low rotational velocities.

The rotatable frame 20, the wafer carrier 22 and wafers 24 rotate as one unit. It is desirable to have the weight distributed as symmetrically as possible about the axis of rotation in order to minimize any rotational imbalance which would cause vibrational forces. Thus, the structure of rotatable frame 20 is preferably symmetrically arranged so as to facilitate dynamic balancing.

While the rotatable frame 20, carrier 22 and wafers 24 are preferably symmetrically arranged to facilitate balancing, the center of wafers 24 are not on the center line of rotation. A slight offset is intentionally introduced by offsetting the wafer carrier 22 slightly below the rotational axis. An offset of approximately 0.040 inches can suffice.

The wafers 24 are not symmetrically located on the rotational axis so that the centrifugal force introduced by the asymmetric rotation will cause the wafers 24 to rest against the carrier 22 during rotation. The wafer retainer bar 38 retains the wafers 24 in the carrier 22 at low rotational speeds. At higher rotational velocities, the wafer 24 are forced away from the retainer bar 38 and into the carrier 22 by centrifugal force.

As shown in FIG. 1, the rotatable frame 20 is at an inclined axis with repect to the horizontal surface such that wafer carrier 22 is inserted at a slightly downward angle when placed into the rotatable frame 20. This downward inclination of wafer carrier 22 causes the disks 24 to have a bias against one side of slots 26 in the carrier 22 so as to inhibit rattling or unwanted vibration of the wafers 24 in the slots 26.

Figure 4:
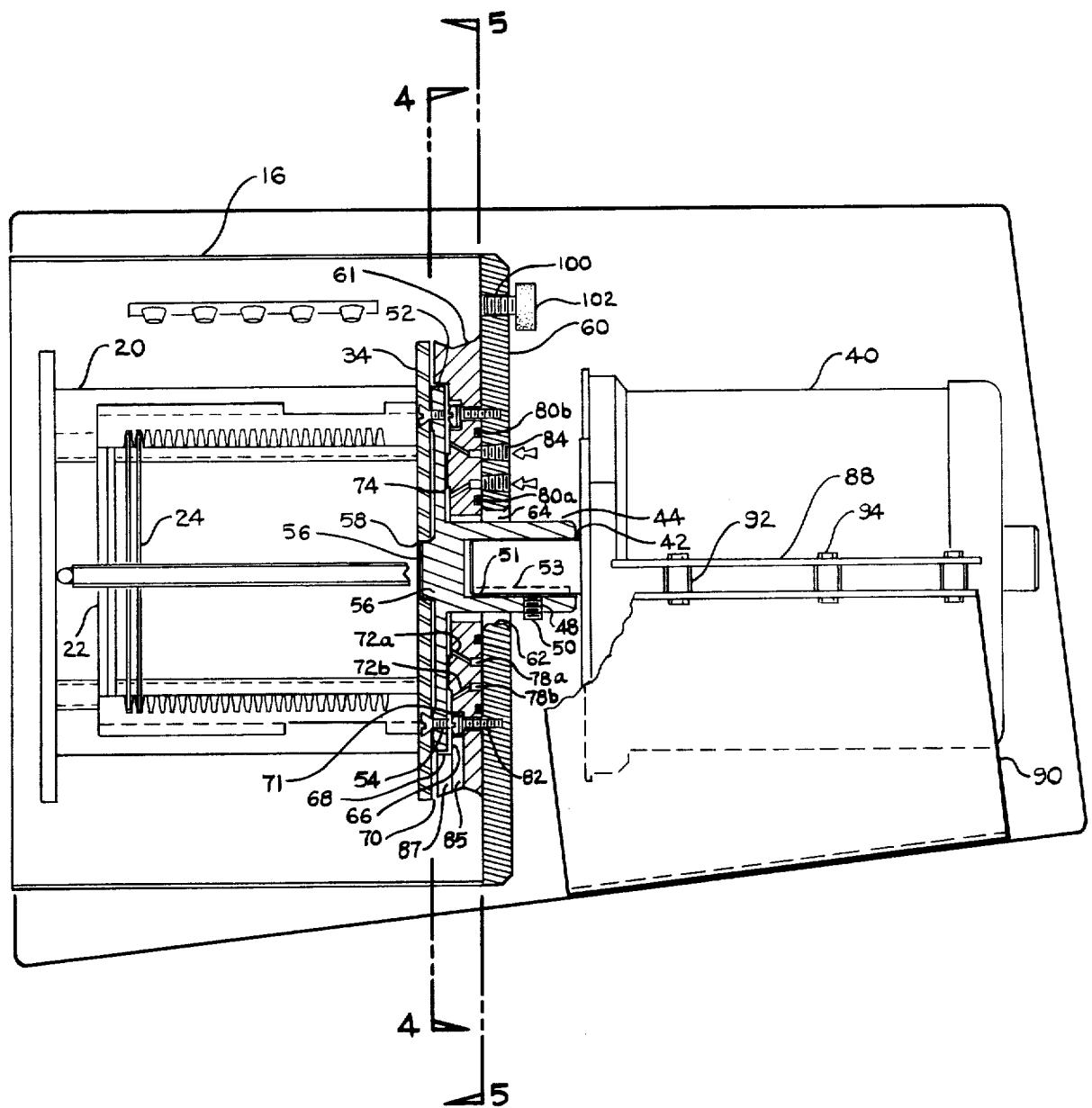
FIG. 4 is a cross-sectional view of the invention taken at 3—3 from FIG. 1, and showing the top of the carrier.

FIG. 4 shows the rotatable frame 20 and wafer carrier 22 enclosed by the container 16, which is in turn enclosed by housing 10. The rotor 34 is connected to, and cantilevered from the drive motor 40. Various means can be used to connect the motor 40 and the rotatable frame 22, but preferably, the drive motor 40 has drive shaft 42 to which is mounted hub 44. Hub 44 has a cylindrical, tubular portion 46 which extends over the drive shaft 42.

A threaded hole 48 is placed through the side of tubular portion 46 so that a set screw 50 can be used to fasten the hub 44 to the drive shaft 42. The screw 50 abuts against key 51 which is placed into slot 53 on drive shaft 42, and a correponding slot 55 in tubular portion 46 of hub 44. Thus the key 51 connects the hub 44 to drive shaft 42. The set screw 50 keeps the key 51 from leaving the slot 53 in drive shaft 42.

Hub 44 also contains a radial flange 52 at the end of tubular portion 46 opposite motor 40. The flange 52 preferably takes the form of a circular disk. The rotor 34 of rotatable frame 20 is fastened to the flange 52 on hub 44. Thus the rotatable frame 20 and carrier 22 are also cantilevered from motor 40. In the embodiment illustrated, screws 54 are used to connect the flange 52 to the rotor 34, although various fastening means could be used. Hub 44 further has a centrally located, projection 56 extending axially beyond the flange 52 and into a hole 58 in the center of rotor 34. The hole 58 and projection 56, in combination with screws 54, are used to position and fasten the rotatable frame 20 on the hub 44.

Still referring to FIG. 4, the container 16 encloses the rotatable frame 20. This enclosure is accomplished by having a hole in the backside of container 16 to accommodate the passage of hub 10 and drive shaft 40. Thus, container 16 contains a back plate 60, on which is fastened a seal plate 61, both plates having an aperture or hole 62 through which the hub 44 and/or the drive shaft 42 extend. The seal plate 61 is adjacent to, but not contacting, the flange 52 of hub 44.

In the illustrated embodiment, the rotor 34 is of larger diameter than flange 52 to which the rotor 34 is fastened. Thus, the rotor 34 and flange 52 form an annular stepped surface with the tubular portion 46 at the center. The seal plate 61 is approximately the same diameter as rotor 34, and has a surface adjacent and corresponding to the annular stepped shape of the rotor 34 and flange 52. The seal plate 61 does not contact the rotor 34 or flange 52, but is separated therefrom by a small space or gap as described hereinafter.

There is a clearance space between the hole 62 and the hub 44 so that there is no contact between the hole 62 and hub 44. The space between hub 44 and hole 62 thus forms a first cylindrical path 64 along the axis of rotation on the outside of hub 44. In order to prevent contaminants from travelling through the gap between hole 62 and hub 44, a positive pressure gas seal is provided. The cylindrical gap forming path 64 is part of this gas seal.

Communicating with this first cylindrical path 64 is a first radial path 66, which is formed by, and comprises the space between the flange 52 and the seal plate 61. This first radial path 66 takes the form of an annular surface, the thickness of which corresponds to the distance between flange 52 and seal plate 61. The inner diameter of the annular-shaped first radial path 66 is limited by the diameter of hub 44. The outer diameter of the path 66 is slightly greater than the outer diameter of circular flange 52.

Communicating with the outer edge of first radial path 66 is a second cylindrical path 68 which extends generally along the edge of flange 52, or, alternately phrased, extends axially along an axis parallel to the axis of rotation of the drive shaft 42. The second cylindrical path 68 is formed by the space between the outer edge of flange 52, and a portion of the seal plate 61 which is configured to substantially enclose the back side and edge of the flange 52. The second cylindrical path 68 thus takes the form of a thin annular space located adjacent the outer edge of flange 52.

Communicating with the second cylindrical path 68 is a second radial path 70 which is formed by the space between the rotor 34 and the seal plate 61. The shape of the second radial path 70 thus takes the form of an annular disk having an inner diameter slightly larger than the outer diameter of flange 52 on hub 44, and an outer diameter approximately equal to than the outer diameter of rotor 34. The outer diameter of the second radial path 70 opens into and communicates with the inside of container 16.

The various inner communicating paths between the rotor 34, hub 44, and seal plate 61, form a labyrinth seal 71 between the inside of the container 16 and the outside of the container 16 adjacent the hub 44. This labyrinth seal 71 advantageously provides a communicating path which inhibits the flow of contaminants into the container 16. The path shape inhibits the free flow of gas and the various turns or changes in path direction provide traps for contaminates. Since this seal 71 contains no contacting or frictional surfaces as would generate particulate contaminants, there is advantageously provided a labyrinth seal which helps minimize particulate contamination. This seal 71 is additionally pressurized with a positive gas pressure in order to prevent any contaminants from entering the container 16 via the pathway of seal 71.

Figure 5:
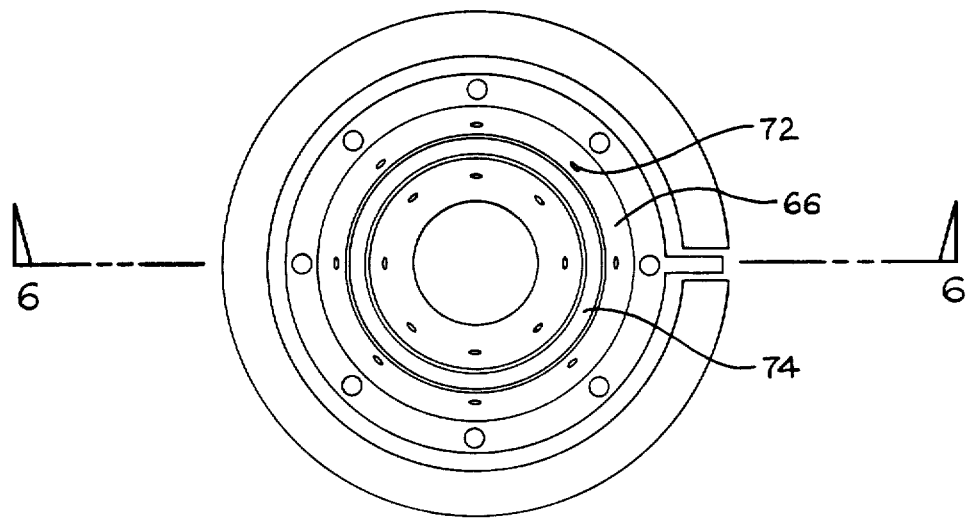
FIG. 5 is a front view of the seal plate taken along line 4—4 of FIG. 4.

The positive gas pressurization to the labyrinth pathway or seal 71 is provided by a plurality of apertures or holes 72 located in the seal plate 61 and opening into first radial path 66. The location of the gas supplying holes 72 can be of diverse placement, but preferably are circularly spaced at intervals of 45°. As shown in FIG. 5, there are two concentric circles of holes 72 which supply gas to the labyrinth seal 71. The gas is preferably nitrogen.

As shown in FIGS. 4 and 5, the holes 72 are shown as occurring in pairs, with a raised portion or boss 74 being located on seal plate 61 between the pairs of holes 72. The boss 74 can be of various shapes but preferably takes the form of an annular ring which partially, but not completely, obstructs the first radial path 66. The boss 74 extends from seal plate 61 which, in turn, is mounted onto back plate 60 of container 16. The top of the boss 74 does not contact the adjacent portion of the flange 52 of hub 44, preferably having a clearance or gap on the order of 0.015 to 0.030 inches. The holes 72 are formed in the seal plate 61 and are in communication with gas supply channels 78.

Figure 7:
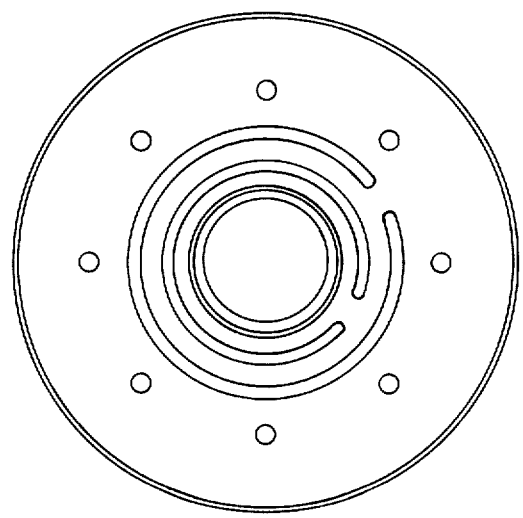
FIG. 7 is a back view of the seal plate view taken along line 5—5 of FIG. 4.
Figure 4:
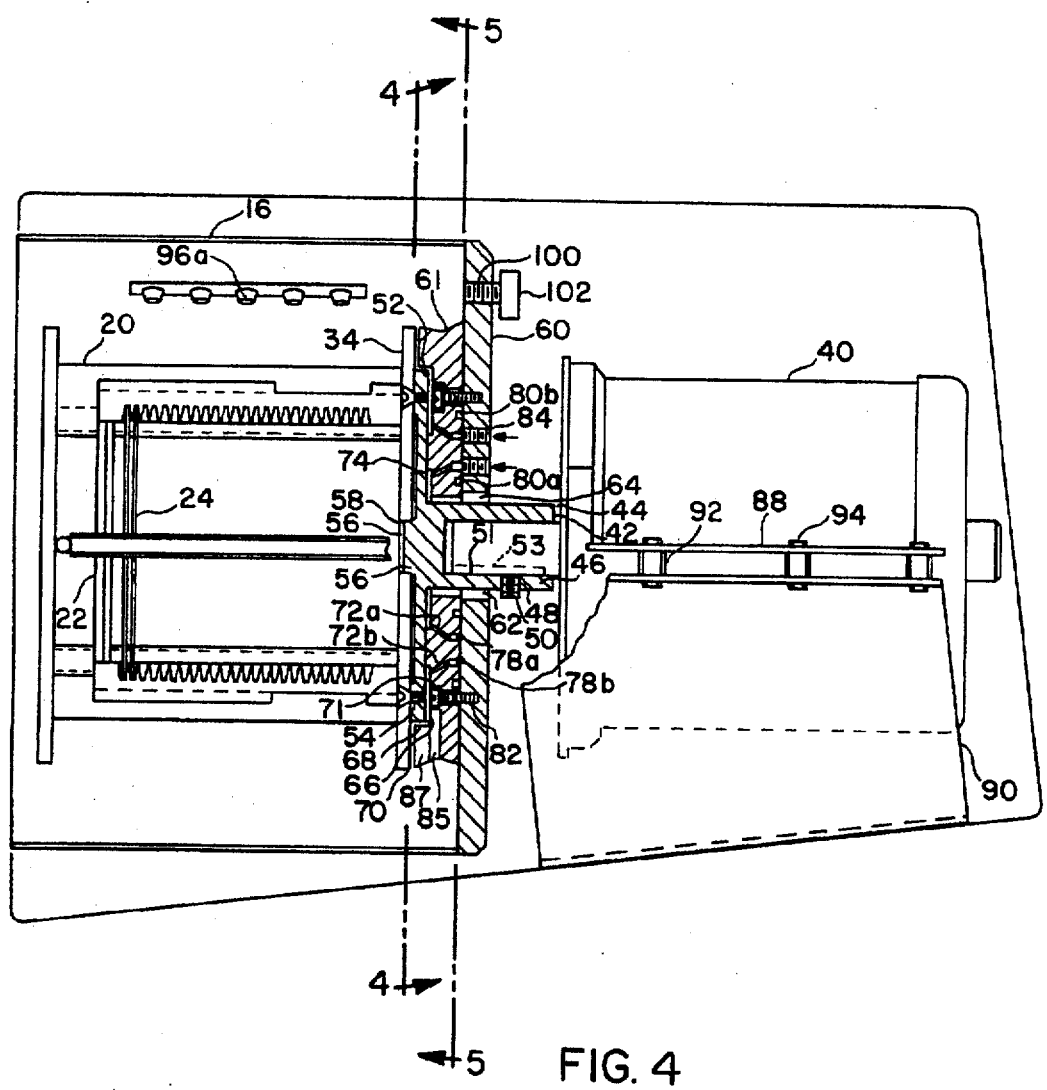
Figure 5:
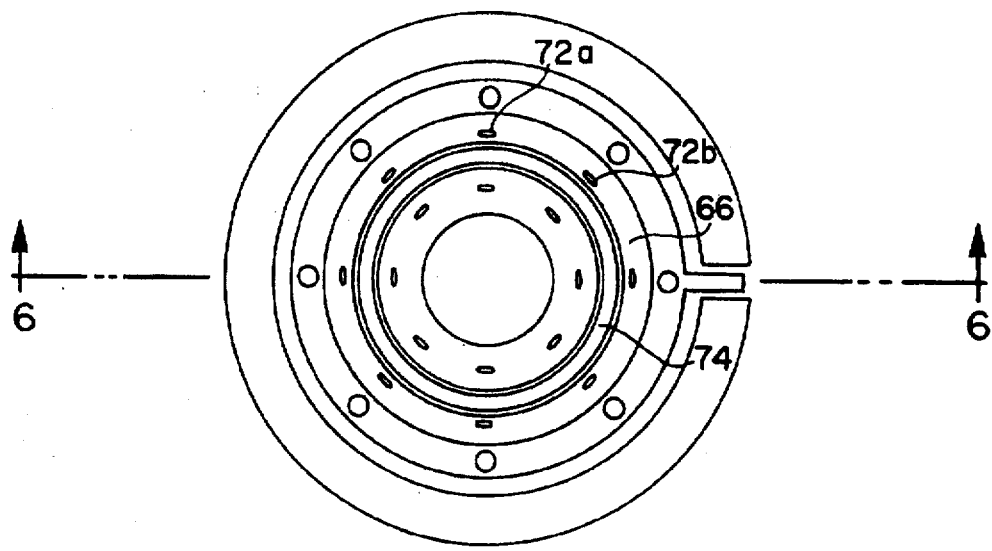
Figure 6:
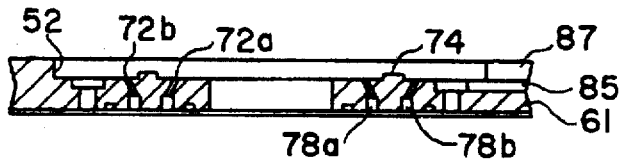
Figure 7:
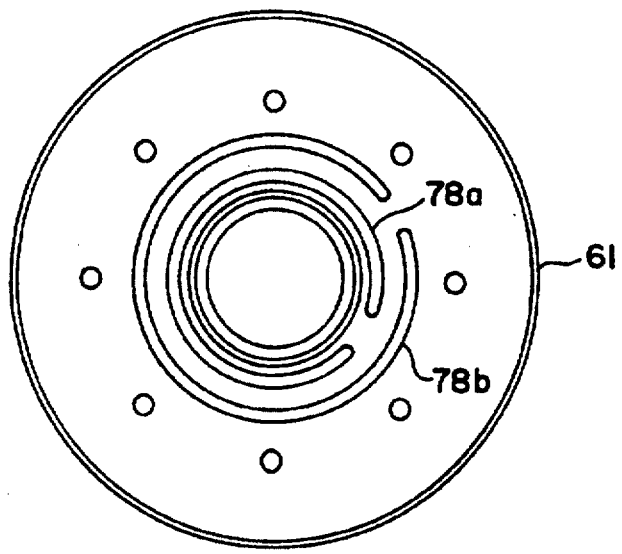

Referring to FIGS. 4 and 7, and especially to FIG. 4, the gas supply channels 78 are located on the back side of the seal plate 61, which side is opposite the side containing the boss 74 and contiguous to back plate 60 of container 16. The gas supply channel 78 are in communication with the holes 72 so that they can provide gas pressure to the second radial path 70, and thereby to the labyrinth seal 71. The gas supply channel 78 can be of diverse shape, but preferably takes the form of a generally circular groove having a rectangular cross-sectional shape in the back of seal plate 61 (FIG. 7). There are preferably two gas channels 78a and b, one channel for each group of the apertures or paired holes 72. The side of the seal plate 61 containing the gas supply channels 78 abuts against the back plate 60.

In order to prevent leakage of the gas from the gas supply channel 78, O ring seals 80a and 80b and provided on the radially inward and radially outward sides of the gas supply channels 78. The seal plate 76 is fastened to the back plate 60 by a plurality of screws 82. Gas inputs 84 communicate with the supply channels 78, and can be connected to gas input lines (not shown) in order to provide gas to the device. The gas enters the input 84, flows through the circular supply channels 78A and B, through the paired holes 72, into the first radial path 66 of labyrinth seal 71.

Referring to FIG. 4, the boss 74 provides a buffer for resistance to the flow of gas across the reduced section between the boss 74 and the back of the cylindrical flange 52. This flow resistance helps prevent the potential entrance of contaminants into the inside of container 16. As the rotatable frame 20 rotates, the gas inside the container 16 will also be rotated by frictional contact with the frame 20. As the gas rotates, centrifugal force tends to force the gas radially outward so that there is a slight pressure differential radially outward from the center of rotation of the rotatable frame 20. This pressure differential can cause a slight vacuum or suction to be exerted on the end of the labyrinth seal 71 in container 16. This slight suction could cause contaminants to be drawn through the labyrinth seal 71. Boss 74 provides a significantly reduced cross-section in the gas pathway which reduces the vacuum effect and inhibits the suction of contaminants into the inside of container 16. In the embodiment shown, the gap between the back of cylindrical flange 52 on rotor 44 and the top of the boss 74 is approximately 0.015 to 0.030 inches, with the boss 74 having a width of approximately 0.3 inches.

Figure 6:
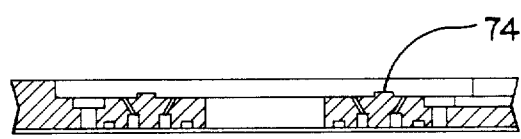
FIG. 6 is a sectional view along 6—6 of FIG. 5.

Referring to FIGS. 4, 5 and 6, an additional design feature resisting the entrance of contaminants along the gas passageway is the use of two gas supply channels 78a and b communicating with the pairs of holes 72 which occur upon opposite sides of the boss 74. The use of gas sources on opposite sides of boss 74 allows a pressure barrier to be established in the restricted area formed between boss 74 and the back of cylindrical flange 52, the gas flowing away from this barrier formed by boss 74. The positive gas pressure is provided through a first series of holes 72a located radially inward of boss 74. These first holes 72a provide a positive gas pressure which exits axially outward along the sides tubular portion 46 of hub 44. This positive gas pressure prevents contaminants from entering the labyrinth seal 71 adjacent the hub 44.

The gas supplied through the second set of holes 72b located radially outward of the boss 74 provide a positive gas pressure which exits radially outward along the back of the rotor 34 and into the inside of container 16. Between each of these gas passages and holes 72a and b is located the boss 74 which forms a restricted gas passage or pressure barrier. The two previously described passages communicate across this restricted passage or barrier. This pressure barrier inhibits the flow of gas and contaminants across the barrier formed by boss 74. The use of boss 74 to provide a pressure barrier thus advantageously provides an additional mechanism to inhibit contaminants from entering the non-load bearing gas seal.

Referring to FIG. 4, the motor 40 has a mounting frame 88 which attaches to support frame 90 through vibration isolation mounts 92. The isolation mounts 92 are connected to the mounting frame 88 and the support frame 90 by fasteners such as bolts 94. A one-quarter horsepower, 90 volt, direct current motor has been found suitable for motor 40. The motor drive shaft 42 is oversized to more readily support the cantilevered and unbalanced rotational load of the rotatable frame 20 and carrier 22. A one inch diameter shaft has proven suitable.

Spray nozzles or orifices 96 are mounted to, and have an orifice projecting into the inside of container 16. The nozzles 96 are located to either side of the wafer carrier 22 so that any fluid entering from the nozzles 96 does not drip down directly onto wafers 24 contained in the carrier 22. In the illustrated embodiment, there are three sets of nozzles 96. At the top left of the container 16 are located nozzles 96a which inject heated gas which gas is used to dry the wafers 24. The gas can be heated by several commercially available devices. The gas heater is not illustrated. At the top right of the container 16 are located nozzles 96b which inject ionized gas during the drying cycle in order to eliminate the build-up of a static charge in container 16. The nozzles 96 a and b preferably inject gas into container 16 even during the wash cycle in order to inhibit the build-up of water pockets in the container 16. The injection of ionized gas preferably does not occur until the drying cycle, but the sequence can be varied as desired.

At the lower right of container 16, substantially below the gas nozzles 96b are located the rinse nozzles 96c, which nozzles inject a fluid such as water in order to rinse and cleanse the wafers 22. By placing the water nozzles 96c below and to the side of the wafer carrier 22, the water npzzles 96c cannot inadvertently drip water onto the wafers 24 after the normal rinse cycle has been completed.

The housing 10 encloses the container 16 and the motor 40 with its support frame 90. The housing 10 also encloses the electronics which control the rinsing and drying sequence. The electronics are of diverse nature and are commonly available in the industry. The electronics are not illustrated.

Near the top of the back plate 60 of container 16 is located an aperture or hole 100 which communicates between the inside of container 16 and the outside of that container. On the outside of container 16, a muffler 102 is threadably connected to hole 100. Muffler 102 can be made of a sintered material such as sintered metal or Teflon. The muffler 102 acts to vent the positive pressure inside the container 16 to the outside of that container. The sintered material of muffler 102 allows the equalization of the gas pressure, but prevents moisture or water vapor from entering the inside of the container 16. The gas exiting from the labyrinth seal 71 in container 16 provides a gas curtain over the opening to hole 100 to prevent particles from entering the hole.

At the bottom of seal plate 61 is located a first slot 85 which is radially oriented. The first slot 85 communicates with and undercuts a portion of the outer edge of the first radial path 66. A second slot 87 partially overlaps and straddles the first slot 85 to form a slot within a slot, the second slot 87 being wider and shallower than the first slot 85. The second slot 87 communicates with and undercuts a portion of the the second cylindrical path 68. The first and second slots 85 and 87 are radially oriented slots which serve to collect any water vapor or moisture which may enter the gas pathways of labyrinth seal 71, especially pathways 70, 68, and 66.

Water, water vapor, or moisture may enter the labyrinth seal 71 since the centrifugally-induced force on the water and vapor in container 16 may exceed the positive pressure with which gas is introduced into the gas labyrinth seal 71. It is desirable to minimize the water and moisture entering the space between housing 10 and container 16 since the water can short out electrical components and moisture can encourage the growth of bacteria and mold as well as facilitate the collection of particulate contaminates from the air. The pressure barrier created by boss 74 prevents water and water vapor from passing through the labyrinth seal 71 into the housing 10. The pressure barrier formed by boss 74 further causes the water vapor and moisture to collect and drip back down the labyrinth seal 71. There is thus advantageously provided a means of preventing water and moisture from traversing the labyrinth seal.

As the water vapor collects in the gas labyrinth seal, centrifugal force causes the water to move radially outward. Referring to FIGS. 4, 5, and 6, there is shown the first and second slots 85 and 87 which allow this collected moisture to exit the labyrinth seal 71 with the help of centrifugal and gravitational force. When the rotor 20 comes to rest, the first and second slots 85 and 87 are preferably locate downward such that gravity will cause any residual moisture to exit through the aforesaid slots 85 and 87. At the bottom of container 16 is located a drain plug (not shown) through which the rinse/wash water is removed from the container 16 prior to drying.

In operation, wafers 24 are inserted into wafer carrier 22. The door 12 is opened and the wafer carrier 22 is inserted through the door 12 into the rotatable frame 20 contained in container 16. The door 12 is then closed. The rotatable frame 20 is then rotated. The wafers 24 are rinsed by water injected from nozzles 96c. The wafers 24 are then dried by heated gas injected through nozzles 96a and b. The rotatable frame 20 rotates with minimum vibration because of the direct coupling to the motor 40. The vibration isolation of the motor 40 by the vibration isolation mounts 92 minimizes the amount of vibration introduced into the housing 10. Contamination is minimized by the positive gas pressure in the gas labyrinth seal 71. There is thus, advantageously provided a rinser or washer/dryer for semi-conductor wafers 24 which minimizes vibration and contamination.

I claim:

1. An apparatus for processing carriers of semi-conductor wafers and glass photomask plates, comprising:
   a rotatable frame configured to releasably hold a carrier;
   a motor connected to the rotatable frame in a direct drive manner to rotate the frame;
   a container enclosing the rotatable frame, the container having an aperture through which the rotatable frame is connected with the drive motor, the container not contacting the rotatable frame or the drive motor;
   means for providing a positive pressure gas seal between the container and the connection between the rotatable frame and the drive motor, the gas seal providing a positive pressure which prevents contaminants from passing through the seal into the inside of the container, the gas seal further providing a positive pressure to the inside of the container.

2. An apparatus as defined in claim 1, further comprising:
   means forming a partial obstruction in the gas seal reducing the cross-sectional area of the seal so as to create a pressure barrier at the reduced cross section, the pressure barrier inhibiting the passage of contaminants across the barrier.

3. An apparatus as defined in claim 1 wherein the gas seal further comprises:
   mean forming two substantially unidirectional gas paths, one path communicating with and positively pressurizing the interior of the container, the second path positively pressurizing and preventing the entrance of contaminants along the aperture through which the rotatable frame connects to the drive motor; and
   means forming a pressure barrier formed by an obstruction reducing the path cross-sectional area, the barrier being located between the first and second paths and allowing communication with both paths, the barrier inhibiting the passage of contaminates across the barrier.

4. An apparatus as defined in claims 1 or 3, further comprising:
   means forming a recess communicating with the gas seal and with the inside of the container in such a manner that condensed liquid can leave the gas seal.

5. An apparatus as defined in claims 1 or 3 wherein the gas seal comprises a labyrinth seal.

6. An apparatus as defined in claim 1 wherein said means providing the gas seal comprises:
   a seal plate on the container and intermediate the container and the rotatable frame, the seal plate forming a gas seal between the plate and the rotatable frame, the seal plate containing gas passages through which positive pressure is provided to the gas seal.

7. An apparatus for processing carriers of semi-conductor wafers and glass photomask plates, comprising:
rotatable frame means for releasably holding a carrier;
a support structure;
a container enclosing the rotatable frame means, the container having a first aperture for inserting and removing the carrier, and a second aperture, the container being mounted to the support structure;
a drive motor mounted to the support structure;
connecting means for connecting the rotatable frame to the drive motor through the second aperture in the container so the rotatable frame means is directly driven by the drive motor;
gas seal means between the container and the connecting means, for maintaining a positive gas pressure to pressurize the inside of the container and to prevent contaminants from passing through the seal means;
gas pressurization means for providing positive gas pressure to the gas seal means.

8. An apparatus as defined in claim 7, further comprising:
recess means in the container, communicating with the gas seal means and with the inside of the container, for allowing the escape of moisture from the gas seal means.

9. An apparatus as defined in claim 7, further comprising:
vent means for allowing the escape of gas from the inside of the container while inhibiting moisture from entering the container.

10. An apparatus as defined in claim 7, wherein the gas seal means comprises:
a labyrinth seal which communicates with the inside of the container and with the outside of the container adjacent the second aperture in the container.

11. An apparatus as defined in claim 7, wherein the gas seal means further comprises:
pressure barrier means for inhibiting passage of contaminates across the barrier means, the barrier means restricting the cross-sectional area of the laybrinth seal to provide a pressure barrier at the restricted cross-section.

12. An apparatus as defined in claim 7, wherein the gas pressurization means comprises:
gas passages communicating with the labyrinth seal means on each side of the barrier means, positive gas pressure being provided through the passages to further maintain the pressure barrier and to encourage the flow of gas away from the barrier.

13. An apparatus for processing carriers of semi-conductor wafers and glass photomask plates, comprising:
a rotatable frame for releasably holding a carrier, the frame configured to support the carrier during rotation such that the center line of rotation does not coincide with the center line of the wafers held in the carrier, the rotatable frame including a front and rear endpiece;
a support structure;
a drive motor mounted to the support structure, the motor having a drive shaft connected to the rear endpiece of the rotatable frame so as to directly drive the frame;
a container enclosing the rotatable frame, the container including a sealable aperture through which the carrier can be removably inserted into the frame;
a seal plate containing a second aperture through which the drive shaft connects to the rear endpiece of the rotatable frame, the seal plate of the container being adjacent to, but separated by a space from, the rotatable frame and the connection between the rear endpiece of the rotatable frame and the motor;
means forming a positive pressure gas seal in said space, the seal communicating with the second aperture in the seal plate to prevent contaminants from entering the seal, the gas seal further communicating with the inside of the container to provide a positive pressure to the inside of the container so as to prevent contaminants from entering the container;
means forming a positive gas pressurization system connected to plural gas apertures in the back plate of the container, the gas apertures communicating with the gas seal so as to provide a positive pressure to the gas seal.

14. An apparatus as defined in claim 13, further comprising:
a hub having a recess for receiving and connecting to the drive shaft, the hub having a radially extending flange located on the inside of the container, which flange is connected to the rear endpiece of the rotatable frame so that the hub connects the drive motor to the rotatable frame in a direct drive configuration.

15. An apparatus as defined in claim 13, wherein the seal comprises:
means forming a first path length adjacent the second aperture in the back plate of the container, the path formed by the space between the second aperture and the connection between the drive shaft and the rear end piece, which connection extends through the second aperture;
means forming a second path length communicating with and extending radially outward from the first path length, the second path length being formed by the space between the flange portion of the hub and the back plate of the container, the second path length communicating with the inside of the container.

16. An apparatus as defined in claim 13, further comprising:
structure defining an obstruction partially blocking the gas seal so as to restrict the cross-sectional area of the gas seal and form a pressure barrier at the restricted area, the pressure barrier inhibiting the movement of contaminants across the barrier.

17. An apparatus as defined in claim 13 wherein there are gas apertures on each side of the obstruction, the gas apertures creating a positive pressure in the gas seal on each side of the obstruction so as to encourage a positive gas flow away from the obstruction.

18. An apparatus as defined in claim 13, further comprising:
vent means for allowing the escape of gas from the inside of the container while inhibiting moisture from entering the container.

19. An apparatus as defined in claim 13, further comprising:
structure defining at least one recess communicating with the portion of the gas seal adjacent the inside of the container to allow the escape of moisture from the seal so that no moisture will be trapped in the labyrinth seal.

20. An apparatus as defined in claims 13 or 15 wherein the gas seal forms a labyrinth-type seal to inhibit contaminants from traversing the seal.

* * * * *

REEXAMINATION CERTIFICATE (1626th)
United States Patent [19]
Hunt et al.

[11] B1 4,571,850
[45] Certificate Issued  Jan. 21, 1992

[54] CENTRIFUGAL WAFER PROCESSOR

[75] Inventors: James R. Hunt, Westminster; Russell P. Balent, Fountain Valley, both of Calif.

[73] Assignee: Verteq, Inc., Anaheim, Calif.

Reexamination Request:
No. 90/002,139, Sep. 14, 1990

Reexamination Certificate for:
Patent No.: 4,571,850
Issued: Feb. 25, 1986
Appl. No.: 611,522
Filed: May 17, 1984

[51] Int. Cl.⁵ .................... F26B 25/00; F26B 11/02
[52] U.S. Cl. ........................................ 34/242; 34/133; 432/242
[58] Field of Search .................... 34/133, 242, 58; 432/242

[56] References Cited
U.S. PATENT DOCUMENTS

| | | |
|---|---|---|
| 1,009,425 | 11/1911 | Ljungström . |
| 1,600,149 | 9/1926 | Surjaninoff . |
| 1,806,929 | 5/1931 | Bath . |
| 2,087,726 | 7/1937 | Bath . |
| 2,125,446 | 8/1938 | Hurtt . |
| 2,407,285 | 9/1946 | King . |
| 2,621,087 | 12/1952 | Kluge . |
| 2,645,033 | 7/1953 | Kling et al. . |
| 2,646,999 | 7/1953 | Barske . |
| 2,805,090 | 9/1957 | Creek . |
| 3,071,384 | 1/1963 | Friberg . |
| 3,141,677 | 7/1964 | Williams . |
| 3,245,334 | 4/1966 | Long . |
| 3,246,901 | 4/1966 | Wickli . |
| 3,251,601 | 5/1966 | Harvey . |
| 3,273,899 | 9/1966 | Warnery . |
| 3,315,968 | 4/1967 | Hanlon . |
| 3,347,604 | 10/1967 | Lavelle et al. . |
| 3,372,735 | 3/1968 | Meijer . |
| 3,392,910 | 7/1968 | Tanzberger . |
| 3,410,565 | 11/1968 | Williams . |
| 3,428,247 | 2/1969 | Andresen et al. . |
| 3,447,843 | 6/1969 | Shipman . |
| 3,467,454 | 9/1969 | Weichsel . |
| 3,561,826 | 2/1971 | Cavy et al. . |
| 3,601,307 | 8/1971 | Shapiro . |
| 3,602,192 | 8/1971 | Grochowski et al. . |
| 3,604,617 | 9/1971 | Patterson . |
| 3,606,288 | 2/1970 | Bloom . |
| 3,679,217 | 7/1972 | Lesiecki . |
| 3,702,704 | 11/1972 | Bloch . |
| 3,746,462 | 7/1973 | Fukuda . |
| 3,756,740 | 9/1973 | Deich et al. . |
| 3,791,657 | 2/1974 | Bilski . |
| 3,792,935 | 2/1974 | Randell . |
| 3,797,962 | 3/1974 | Stahlecker . |
| 3,907,457 | 9/1975 | Nakamura et al. . |
| 3,927,890 | 12/1975 | Adams, Jr. . |
| 3,932,988 | 1/1976 | Beaufrere . |
| 3,939,904 | 2/1976 | Beaufrere . |
| 3,940,153 | 2/1976 | Stocker . |
| 3,942,908 | 3/1976 | Pilarczyk . |
| 3,976,165 | 8/1976 | Pilarczyk . |
| 4,002,033 | 1/1977 | Welch . |
| 4,040,474 | 8/1977 | Stroom et al. . |
| 4,057,371 | 11/1977 | Pilarczyk . |
| 4,099,727 | 7/1978 | Weiler . |
| 4,132,567 | 1/1979 | Blackwood . |
| 4,140,270 | 2/1979 | Dowd et al. . |
| 4,148,494 | 4/1979 | Zelahy et al. . |
| 4,167,243 | 9/1979 | Jackson . |
| 4,167,915 | 9/1979 | Toole et al. . |
| 4,192,516 | 3/1980 | McCort . |
| 4,199,154 | 4/1980 | Mueller . |
| 4,218,066 | 8/1980 | Ackermann . |
| 4,227,703 | 10/1980 | Stalker et al. . |
| 4,257,617 | 3/1981 | Hill . |
| 4,265,455 | 5/1981 | Lundgren . |
| 4,269,418 | 5/1981 | Valentini et al. . |
| 4,290,611 | 9/1981 | Sedy . |
| 4,312,294 | 1/1982 | Satoh . |
| 4,335,885 | 6/1982 | Heshmat . |
| 4,386,780 | 6/1983 | Dernedde . |
| 4,395,048 | 7/1983 | Timmermans et al. . |
| 4,402,515 | 9/1983 | Malott . |
| 4,406,466 | 9/1983 | Geary, Jr. . |
| 4,426,087 | 1/1984 | Sargent et al. . |
| 4,427,378 | 1/1984 | Bowers . |

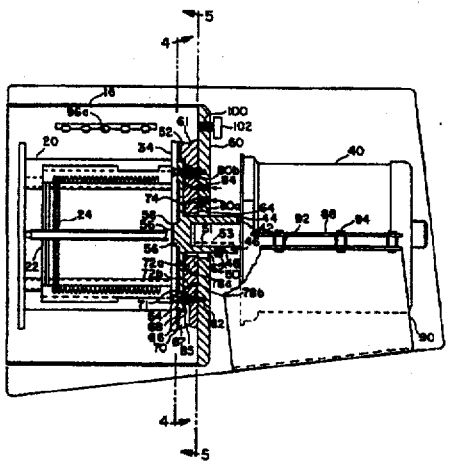

| | | |
|---|---|---|
| 4,457,359 | 7/1984 | Holden . |
| 4,457,515 | 7/1984 | Eidschun . |
| 4,527,620 | 7/1985 | Pedersen et al. . |
| 4,535,834 | 8/1985 | Turner . |
| 4,565,378 | 1/1986 | Wehrfritz et al. . |
| 4,606,137 | 8/1986 | Whipple . |
| 4,629,197 | 12/1986 | Schütte et al. . |

FOREIGN PATENT DOCUMENTS

| | | |
|---|---|---|
| 524515 | 5/1931 | Fed. Rep. of Germany . |
| 927842 | 5/1955 | Fed. Rep. of Germany . |
| 3342973 | 6/1984 | Fed. Rep. of Germany . |
| 538984 | 3/1922 | France . |
| 52-57410 | 5/1977 | Japan . |
| 54-140055 | 10/1979 | Japan . |
| 54-5153 | 11/1979 | Japan . |
| 55-86964 | 7/1980 | Japan . |
| 57-103975 | 6/1982 | Japan . |
| 58-168238 | 10/1983 | Japan . |
| 59-90928 | 5/1984 | Japan . |
| 306734 | 7/1955 | Switzerland . |
| 19248 | of 1907 | United Kingdom . |
| 920892 | 3/1963 | United Kingdom . |

OTHER PUBLICATIONS

Buchter, H. Hugo, *Industrial Sealing Technology*, John Wiley & Sons, New York, 1979.

Semitool Assembly Drawing and Parts List for Rinser-Dryer, circa 1980.

Copy of a Drawing Marked "Deposition Exhibit 9".

Copies of the Section on Labyrinth Seals from the 1964 Edition of *Mechanical Design & Systems Handbook*.

Copy of a Drawing Marked "Deposition Exhibit 9", Auto/Unload Chemical Processor Semitool Inc., 1982.

Copies of the Section on Labyrinth Seals from the 1964 Edition of *Mechanical Design & Systems Handbook*.

Buchter, H. Hugo, *Industrial Sealing Technology*, John Wiley & Sons, New York, 1979.

Tempress-Corotek Brochure, *The Centri Etcher*, 1977.

Corotek Processing Systems, *Multipurpose Centri Etcher/Stripper*, 1977.

Drawing of Semitool pre-Diffusion Cleaner, 1977.

Semitool Brochure, *In-Line Pre-Diffusion Cleaner*, 1977.

Sola Basic Tempress Microelectronics Brochure, *Tempress Model 420 Rinser/Dryer*, Aug. 1977.

Sola Basic Tempress Microelectronics, *Model 420 Rinser/Dryer Installation and Service Manual*, Aug. 1977.

Sola Basic Tempress Microelectronics, *Price List Garden Grove Products*, 1977.

Sola Basic Tempress Microelectronics, *Lessen Plan*, 1977.

NACOM Parts List and Drawing, Mar. 26, 1982.

Drawings of Direct Drive Processing Equipment, Feb. 1984.

*Primary Examiner*—Henry Bennett

[57] ABSTRACT

In a rinser/dryer for carriers of semiconductor wafers, a rotatable frame containing the carrier is directly mounted to, and cantilevered from the drive motor. A container encloses the rotatable frame and carrier. A gas pressurized labyrinth seal separates the inside of the container from the drive motor to prevent contamination. A raised portion in the labyrinth seal, with gas inlets on each side of the raised portion, forms a pressure barrier inhibiting the passage of moisture and contaminates across the barrier.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

In FIG. 4 Reference Numerals 46 and 96A were added, In FIG. 5 Reference Numerals 72A and 72B were added, in FIG. 6 Reference Numerals 52, 61, 72A, 72B, 78A, 78B, 85 and 87 were added, In FIG. 7. Reference Numerals 61, 78A and 78B were added.

AS A RESULT OF REEXAMINATION, IT HAS BEEN DETERMINED THAT:

The patentability of claims 13-16 and 18-20 is confirmed.

Claims 1, 7, 11, 12 and 17 are determined to be patentable as amended.

Claims 2-6 and 8-10, dependent on an amended claim are determined to be patentable.

New claims 21 and 22 are added and determined to be patentable.

1. An apparatus for processing carriers of semi-conductor wafers and glass photomask plates, comprising:
    a rotatable frame configured to releasably hold a carrier;
    a motor connected to the rotatable frame in a direct drive manner to rotate the frame;
    a container enclosing the rotatable frame, the container having an aperture through which the rotatable frame is connected with the drive motor, the container not contacting the rotatable frame or the drive motor;
    means for providing a positive pressure gas seal between *the rotating and non-rotating parts of* the container and the connection between the rotatable frame and the drive motor, the gas seal providing a positive pressure which prevents contaminants from passing through the seal into the inside of the container, *there being no contact seal between said parts*, the gas seal further providing a positive pressure to the inside of the container.

7. An apparatus for processing carriers of semi-conductor wafers and glass photomask plates, comprising:
    rotatable frame means for releasably holding a carrier;
    a support structure;
    a container enclosing the rotatable means, the container having a first aperture for inserting and removing the carrier, and a second aperture, the container being mounted to the support structure;
    a drive motor mounted to the support structure;
    connecting means for connecting the rotatable frame to the drive motor through the second aperture in the container so the rotatable frame means is directly driven by the drive motor;
    gas seal means between *the non-rotating and rotating parts of* the container and the connecting means, for maintaining a positive gas pressure to pressurize the inside of the container and to prevent contaminants from passing through the seal means, *there being no contact seal between said parts;*
    gas pressurization means for providing positive gas pressure to the gas seal means.

11. An apparatus as defined in claim [7,] *10*, wherein the gas seal means further comprises:
    pressure barrier means for inhibiting passage of contaminants across the barriers means, the barrier means restricting the cross-sectional area of the labyrinth seal to provide a pressure barrier at the restricted cross-section.

12. An apparatus as defined in claim [7,] *11* wherein the gas pressurization means comprises:
    gas passages communicating with the labyrinth seal means on each side of the barrier means, positive gas pressure being provided through the passages to further maintain the pressure barrier and to encourage the flow of gas away from the barrier.

17. An apparatus as defined in claim [13] *16*, wherein there are gas apertures on each side of the obstruction, the gas apertures creating a positive pressure in the gas seal on each side of the obstruction so as to encourage a positive gas flow away from the obstruction.

*21. An apparatus for processing carriers of semi-conductor wafers, comprising:*
    *a rotatable frame configured to releasably hold one of said carriers;*
    *a motor directly driving and rotatably supporting the frame in a generally horizontal cantilever fashion;*
    *a container enclosing the frame within the interior of the container and having an aperture through which the rotatable support between the motor and the frame extends, the motor being located on the exterior of the container;*
    *a structuring forming a gaseous flow path along said rotatable support between the interior of the container and the exterior of the container, without contact between rotating and non-rotating components along said path; and*
    *one or more inputs for introducing pressurized gas into said path in a location between the interior and exterior of the container in a manner such that one leg of said path forms a gas seal that opens to provide a positive pressure to the interior of the container and to prevent contaminants from passing through the seal, and a second leg of the path forms a gas seal that opens to the exterior of the container and prevents the entrance of contaminants into said container along said aperture.*

*22. The apparatus of claim 21, including an obstruction reducing the flow path cross-sectional area located between the legs of said path and allowing gas communication with both legs, the obstruction inhibiting the passage of contaminants across the obstruction.*

* * * * *